(12) United States Patent
Lee (10) Patent No.: US 8,497,493 B2
(45) Date of Patent: Jul. 30, 2013

(54) GROWTH SUBSTRATE AND LIGHT EMITTING DEVICE

(75) Inventor: Jeong Sik Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/361,571

(22) Filed: Jan. 30, 2012

(65) Prior Publication Data

US 2012/0199810 A1    Aug. 9, 2012

(30) Foreign Application Priority Data

May 20, 2011    (KR) .................. 10-2011-0047699

(51) Int. Cl.
*H01L 29/06* (2006.01)

(52) U.S. Cl.
USPC ................. 257/13; 257/12; 257/E29.105; 257/E33.008; 438/20

(58) Field of Classification Search
USPC .......... 257/12–13, E33.008, E29.105; 438/20
See application file for complete search history.

(56) References Cited

U.S. PATENT DOCUMENTS

2012/0007039 A1*    1/2012    Ueta et al. ...................... 257/13

* cited by examiner

*Primary Examiner* — Jami M Valentine
(74) *Attorney, Agent, or Firm* — Birch, Stewart, Kolasch & Birch, LLP (57) ABSTRACT

Disclosed are a growth substrate and a light emitting device. The light emitting device includes a silicon substrate, a first buffer layer disposed on the silicon substrate and having an exposing portions of the silicon substrate, a second buffer layer covering the first buffer layer and the exposed portions of the silicon substrate, wherein the second buffer layer is formed of a material causing a eutectic reaction with the silicon substrate, a third buffer layer disposed on the second buffer layer, and a light emitting structure disposed on the third buffer layer, and the second buffer layer includes voids.

20 Claims, 10 Drawing Sheets

GROWTH SUBSTRATE AND LIGHT EMITTING DEVICE

CROSS REFERENCE TO RELATED APPLICATION

This application claims priority under 35 U.S.C. §119 to Korean Patent Application No. 10-2011-0047699, filed in Korea on May 20, 2011, which are hereby incorporated in its entirety by reference as if fully set forth herein.

TECHNICAL FIELD

Embodiments relate to a growth substrate for growing a semiconductor material and a light emitting device.

BACKGROUND

A light emitting device uses a phenomenon in which light is emitted when forward current flows through a PN junction diode of a compound semiconductor, and mainly serves as a light source of a display device. Such a light emitting device does not require a filament, differently from an electric bulb, is resistant to vibration, and has a long lifespan and a fast response time.

Although an epi-layer is generally grown on a sapphire substrate, a technique for growing an epi-layer on a silicon substrate has been developed. However, as a nitride semiconductor layer (for example, a GaN layer) is grown on a silicon substrate, a lattice constant difference and a thermal expansion coefficient difference between the silicon substrate and the GaN layer is present and thus crystalline defects may occur.

SUMMARY

Embodiments provide a growth substrate which has improved quality while reducing strain, and a light emitting device.

In one embodiment, a growth substrate includes a base substrate, a first buffer layer disposed on the base substrate and having an exposing portions of the base substrate, a second buffer layer covering the first buffer layer and the exposed portions of the base substrate, wherein the second buffer layer is formed of a material causing a eutectic reaction with the base substrate, and a third buffer layer disposed on the second buffer layer, wherein the second buffer layer includes voids.

The base substrate may be a silicon substrate.

The first buffer layer may include pin holes or islands exposing the portions of the base substrate, wherein the islands are separated from each other. The second buffer layer may be formed of a material having a lower melting point than the first buffer layer. The third buffer layer may be formed of the same material as the first buffer layer.

The second buffer layer may be formed of a nitride semiconductor having a formula of $Al_xM_yGa_{(1-x-y)}N$ ($0 \leq x+y \leq 1$, $0 \leq x \leq 0.5$, M=indium (In) and/or boron (B)). The first buffer layer and the third buffer layer may be formed of a nitride semiconductor having a formula of $Al_xIn_yGa_{(1-x-y)}N$ ($0 \leq x+y \leq 1$, $0 \leq y \leq 0.5$). An Al content of the second buffer layer may be smaller than an Al content of the first buffer layer and the third buffer layer.

The voids may be formed between the base substrate and the third buffer layer. Portions of the silicon substrate under the voids may include holes. The second buffer layer may include GaSi. A thickness of the third buffer layer may be greater than a thickness of the first buffer layer.

In another embodiment, a light emitting device includes a silicon substrate, a first buffer layer disposed on the silicon substrate and having an exposing portions of the silicon substrate, a second buffer layer covering the first buffer layer and the exposed portions of the silicon substrate, wherein the second buffer layer is formed of a material causing a eutectic reaction with the silicon substrate, a third buffer layer disposed on the second buffer layer, and a light emitting structure disposed on the third buffer layer, wherein the second buffer layer includes voids.

The first buffer layer may include pin holes or islands exposing the portions of the base substrate, wherein the islands are separated from each other.

The second buffer layer may be formed of a material having a lower melting point than the first buffer layer.

The second buffer layer may be formed of a nitride semiconductor having a formula of $Al_xM_yGa_{(1-x-y)}N$ ($0 \leq x+y \leq 1$, $0 \leq x \leq 0.5$, M=indium (In) and/or boron (B)). The first buffer layer and the third buffer layer may be formed of a nitride semiconductor having a formula of $Al_xIn_yGa_{(1-x-y)}N$ ($0 \leq x+y \leq 1$, $0 \leq y \leq 0.5$).

An Al content of the second buffer layer may be smaller than an Al content of the first buffer layer and the third buffer layer. Portions of the silicon substrate under the voids may include holes. The second buffer layer may include GaSi.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Hereinafter, embodiments will be described with reference to the annexed drawings.

It will be understood that when an element is referred to as being "on" or "under" another element, it can be directly on/under the element, and one or more intervening elements may also be present. When an element is referred to as being "on" or "under", "under the element" as well as "on the element" can be included based on the element.

In the drawings, the thicknesses or sizes of respective elements may be exaggerated, omitted or schematically illustrated for convenience and clarity of description. Further, the sizes of the respective elements do not indicate the actual sizes of the respective components. Moreover, the same numbers refer to the same elements throughout the description of the drawings. Hereinafter, light emitting devices, manufacturing methods thereof, and light emitting device packages in accordance with embodiments will be described with reference to the annexed drawings.

FIGS. 1 to 4 are longitudinal-sectional views illustrating a manufacturing method of a light emitting device in accordance with one embodiment.

Figure 1:
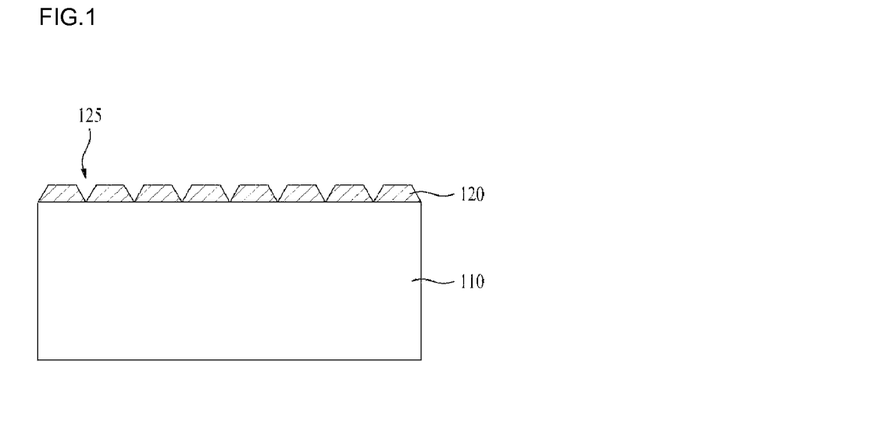
FIGS. 1 to 4 are longitudinal-sectional views illustrating a manufacturing method of a light emitting device in accordance with one embodiment.

With reference to FIG. 1, a first buffer layer 120 exposing portions of a silicon substrate 110 is grown on the silicon substrate 110. Here, the first buffer layer 120 may have a structure provided with pin holes 125 exposing the portions of the silicon substrate 110.

As a method of growing the first buffer layer 120, metal organic chemical vapor deposition (MOCVD) or chemical vapor deposition (CVD) may be used.

For example, the first buffer layer 120 may have a formula of $Al_xIn_yGa_{(1-x-y)}N$ ($0 \leq x+y \leq 1$, $0 \leq y \leq 0.5$) using an aluminum source. Here, the pin holes 125 may have the shape of a six-sided pyramid, but are not limited thereto and may have various shapes, such as a cylinder, a polyhedron, etc.

Figure 2:
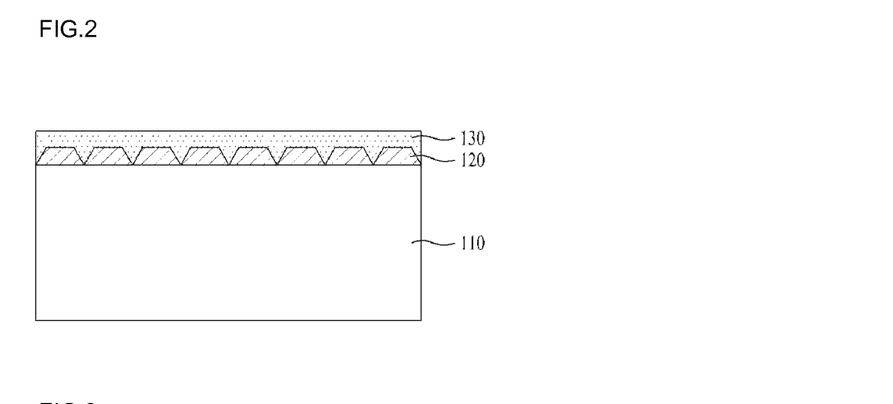

With reference to FIG. 2, the first buffer layer 120 provided with the pin holes 125 and the exposed silicon substrate 110 are covered with a second buffer layer material 130.

The second buffer layer material 130 may fill the pin holes 125, and have a regular thickness on the first buffer layer 120. Here, the second buffer layer material 130 may be contact with the silicon substrate 110 exposed by the pin holes 125.

As a method of forming the second buffer layer material 130, metal organic chemical vapor deposition (MOCVD), chemical vapor deposition (CVD), or molecular beam epitaxy (MBE) may be used.

Here, the second buffer layer material 130 may have a lower melting point than the first buffer layer 120. For example, the second buffer layer material 130 may cause a eutectic reaction with the silicon substrate 110, and the melting point of the second buffer layer material 130 may be lower than the melting point of the first buffer layer 120 due to the eutectic reaction.

The second buffer layer material 130 may be formed of a nitride semiconductor having a formula of $Al_xM_yGa_{(1-x-y)}N$ ($0 \leq x+y \leq 1$, $0 \leq x \leq 0.5$, M=indium (In) and/or boron (B)). An Al content of the second buffer layer material 130 is adjusted to be smaller than an Al content of the first buffer layer 120. Thereby, a Ga content of the second buffer layer material 130 becomes relatively greater than a Ga content of the first buffer layer 120, and thus the melting point of the second buffer layer material 130 may be lower than the melting point of the first buffer layer 120

Figure 11:
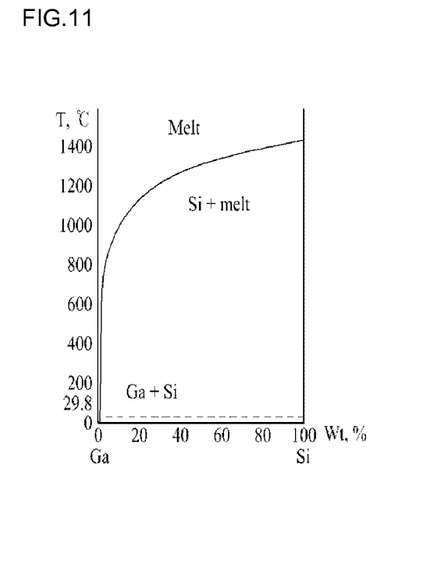
FIG. 11 is a graph illustrating an equilibrium state of gallium-silicon.

FIG. 11 is a graph illustrating an equilibrium state of gallium (Ga)-silicon (Si), i.e., illustrating change of the melting point due to the eutectic reaction between gallium and silicon. Here, the X axis represents a relative content (%) of silicon in gallium-silicon, and the y axis represents a melting point of gallium-silicon.

With reference to FIG. 11, it is understood that the melting point of gallium-silicon is lowered as the Ga content increases. For example, the melting point of silicon is about 1,400° C. and the melting point of gallium is about 29.8° C., but a eutectic product of Ga(80%)-Si(20%) may have a low melting point of about 1,000° C.

Therefore, when a thermal process of a temperature more than a melting point of the eutectic reaction is carried out after formation of the second buffer layer material 130 or during formation of the second buffer layer material 130, the first buffer layer 120 is not melted, but portions of the second buffer layer materials 130 may be melted due to the eutectic reaction with the substrate 110.

Gallium (Ga) of the second buffer layer material 130 causes the eutectic reaction with silicon (Si) of the silicon substrate 110 and is converted into amorphous GaSi 132, and nitrogen (N) of the second buffer layer material 130 may be evaporated. As the density at the portions of the second buffer layer material 130 causing the eutectic reaction is changed and nitrogen (N) of the portions of the second buffer layer material 130 causing the eutectic reaction is evaporated, voids 152 (with reference to FIGS. 4 and 5) may be formed within the pin holes 125.

As the thermal process continues, the second buffer layer material 130 may be transformed into a second buffer layer 130A (with reference to FIGS. 3 and 4) including the voids 152.

Figure 3:
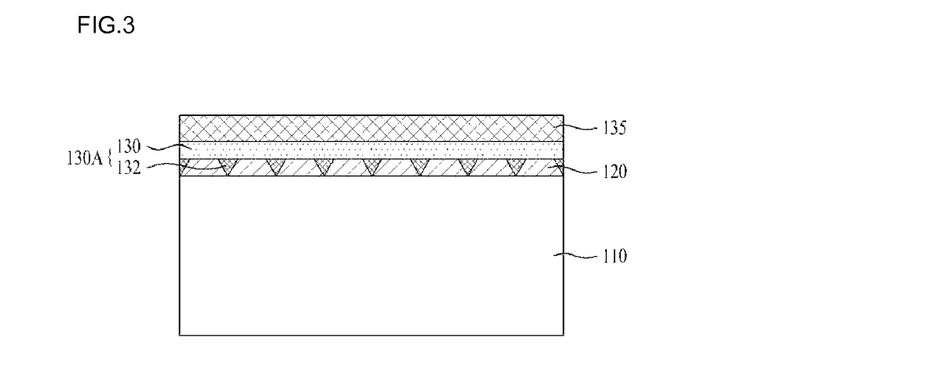
Figure 4:
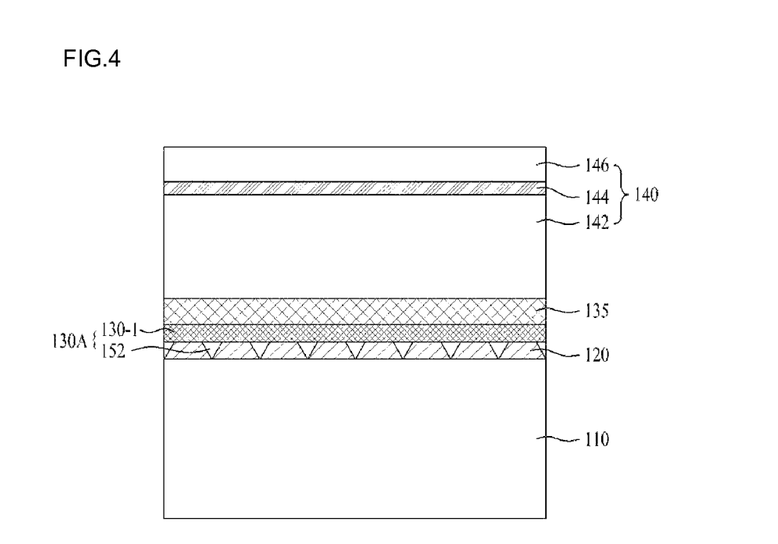

Then, with reference to FIGS. 3 and 4, a third buffer layer 135 is formed on the second buffer layer material 130.

The third buffer layer 135 may be formed of the same material as the first buffer layer 120, for example, a nitride semiconductor having a formula of $Al_xIn_yGa_{(1-x-y)}N$ ($0 \leq x+y \leq 1$, $0 \leq y \leq 0.5$). The third buffer layer 135 may be formed of a material which does not cause the eutectic reaction with the silicon substrate 110, in the same manner as the first buffer layer 120.

A semiconductor layer 140 is formed on the third buffer layer 135. For example, the semiconductor layer 140 may be a light emitting structure which emits light. Although the embodiment illustrates the semiconductor layer 140 as being the light emitting structure, the semiconductor layer 140 is not limited thereto.

The light emitting structure 140 may include a first conductivity-type semiconductor layer 142, an active layer 144 and a second conductivity-type semiconductor layer 146, and a detailed description thereof will be given later.

The third buffer layer 135 is formed between the light emitting structure 140 and the second buffer layer 130A, is formed of the same material as the first buffer layer 130, and serves to prevent the second buffer layer material 130 from causing the eutectic reaction with the silicon substrate 110 anymore. The third buffer layer 135 restricts the eutectic reaction to a region between the silicon substrate 110 and the second buffer layer material 130. This prevents the third buffer layer 135 from being melted and thus prevents the eutectic reaction from being diffused to the light emitting structure 140, when the second buffer layer material 130 is melted due to the eutectic reaction with the silicon substrate 110. A thickness of the third buffer layer 135 may be greater than a thickness of the first buffer layer 120.

FIG. 3 illustrates the GaSi 132 formed within the pin holes 125 due to the eutectic reaction, and FIG. 4 illustrates conversion of a portion 130-1 of the second buffer layer 130A located on the first buffer layer 120 into GaSi, as the eutectic reaction proceeds, and illustrates the voids 152 formed within the pin holes 125.

As the eutectic reaction is gradually deepened, the voids 152 may be formed at the portion 130-1 of the second buffer layer 130A located on the first buffer layer 120. Although the embodiment illustrates formation of the voids 152 within the pin holes 125 and conversion of the portion 130-1 of the second buffer layer 130A located on the first buffer layer 120 into GaSi, the disclosure is not limited thereto. In accordance with other embodiments, the size of the voids 152 and the extent of the portion of the second buffer layer 130A converted into GaSi may be changed according to process conditions.

The size of the formed voids 152 may be determined by a process time, a process temperature, the thicknesses and densities of the first buffer layer 120 and the second buffer layer 130A, and the size of the pin holes 125.

The height of the lower surface of the second buffer layer 130A exposed according to formation of the voids 152 may be equal to or differ from the height of the upper surface of the first buffer layer 120.

For example, a distance from the surface of the silicon substrate 110 to the lower surface of the second buffer layer 130a exposed by the voids 152 may be equal to the thickness of the first buffer layer 120.

Further, the distance from the surface of the silicon substrate 110 to the lower surface of the second buffer layer 130a exposed by the voids 152 may be smaller than or equal to the thickness of the first buffer layer 120. Further, distance from the surface of the silicon substrate 110 to the lower surface of the second buffer layer 130a exposed by the voids 152 may be greater than the thickness of the first buffer layer 120.

Figure 5:
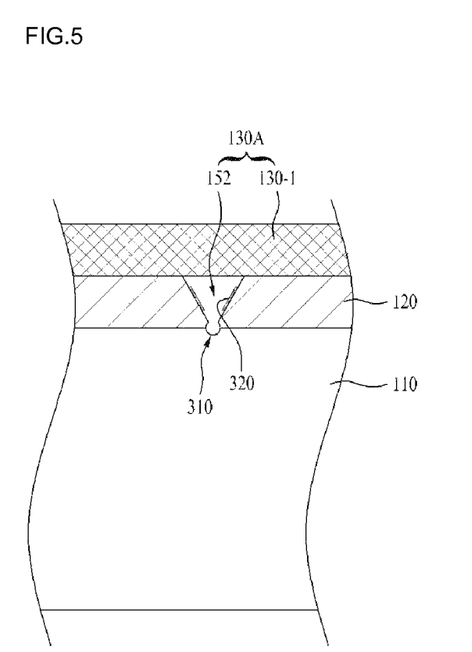
FIG. 5 is a partially enlarged view of a void shown in FIG. 4.

FIG. 5 is a partially enlarged view of the void 152 shown in FIG. 4. With reference to FIG. 5, the voids 152 are formed within the pin holes 125 due to formation of gallium-silicon and evaporation of nitrogen according to the eutectic reaction, and the amorphous GaSi 320 may remain on the surfaces of the first buffer layers 120 exposed due to formation of the voids 152. Further, holes or voids 310 may be formed at portions of the silicon substrate 110 contacting the second buffer layer material 130 through the pin holes 125 due to the eutectic reaction.

The light emitting structure 140 may be formed using a method, such as a metal organic chemical vapor deposition (MOCVD), chemical vapor deposition (CVD), plasma-enhanced chemical vapor deposition (PECVD), molecular beam epitaxy (MBE), or hybrid vapor phase epitaxy (HVPE).

Through the above method, the first conductivity-type semiconductor layer 142, the active layer 144, and the second conductivity-type semiconductor layer 146 may be sequentially formed on the third buffer layer 135.

The first conductivity-type semiconductor layer 142 is formed on the third buffer layer 135, and may be formed of a compound semiconductor of group III-V elements doped with a first conductivity-type dopant. The first conductivity-type semiconductor layer 142 may be formed of a semiconductor material having a formula of $In_xAl_yGa_{1-x-y}N$ ($0 \leq x \leq 1$, $0 \leq y \leq 1$, $0 \leq x+y \leq 1$), for example, one selected from among the group consisting of GaN, AlN, AlGaN, InGaN, InN, InAlGaN, AlInN, AlGaAs, GaP, GaAs, GaAsP, AlGaInP, etc. and be doped with an N-type dopant, such as Si, Ge, Sn, Se, Te, etc.

The active layer 144 may generate light by energy generated during recombination of electrons and holes provided from the first conductivity-type semiconductor layer 142 and the second conductivity-type semiconductor layer 146. The active layer 144 may be formed of a semiconductor material having a formula of $In_xAl_yGa_{1-x-y}N$ ($0 \leq x \leq 1$, $0 \leq y \leq 1$, $0 \leq x+y \leq 1$). The active layer 144 may have at least one selected from among the group consisting of a single quantum well structure, a multi quantum well (MQW) structure, a quantum dot structure and a quantum wire structure.

The second conductivity-type semiconductor layer 146 may be formed of a compound semiconductor of group III-V elements doped with a second conductivity-type dopant. The second conductivity-type semiconductor layer 146 may be formed of a semiconductor material having a formula of $In_xAl_yGa_{1-x-y}N$ ($0 \leq x \leq 1$, $0 \leq y \leq 1$, $0 \leq x+y \leq 1$), for example, one selected from among the group consisting of GaN, AlN, AlGaN, InGaN, InN, InAlGaN, AlInN, AlGaAs, GaP, GaAs, GaAsP, AlGaInP, etc. and be doped with a P-type dopant, such as Mg, Zn, Ca, Sr, Ba, etc.

A conductive clad layer may be formed between the active layer 144 and the first conductivity-type semiconductor layer 142 or between the active layer 144 and the second conductivity-type semiconductor layer 146. The conductive clad layer may be formed of an AlGaN-based semiconductor.

Further, in order to prevent dislocation due to a lattice constant difference, a superlattice layer (not shown) may be formed between the third buffer layer 135 and the first conductivity-type semiconductor layer 142. Here, the superlattice layer may be an AlGaN layer.

In general, in order to reduce strain due to a lattice constant difference between GaN and Si and to prevent melting (hereinafter, referred to as "melt-back") of the lower surface of the GaN layer due to a eutectic reaction between Ga and Si when the GaN layer is grown on the silicon substrate, a nitride layer, such as an AlN layer or an AlGaN layer, is formed between the silicon substrate and the GaN layer.

However, strain reduction effects using a nitride are not sufficient, and thus wafer bowing may occur. Wafer bowing refers to warpage of a wafer after growth of a GaN layer has been completed. Further, if the thickness of the AlN layer or the AlGaN layer is increased to prevent melt-back, the crystalline quality of the GaN layer may be deteriorated and thus the quality of the light emitting device may be lowered.

However, in the embodiment, since the voids 152 are formed within the pin holes 125 due to the eutectic reaction between the second buffer layer material 130 and the silicon substrate 110 after formation of the first buffer layer 120 provided with the pin holes 125, strain due to the lattice constant difference between the silicon substrate 110 and GaN may be reduced.

That is, the voids are formed in the second buffer layers 130A between the silicon substrate 110 and the buffer layer 135 during growth of the nitride semiconductor layers 130, 135 and 140 on the silicon substrate 110, and thus reduces or eliminates strain caused by a lattice constant difference between the silicon substrate 110 and the nitride semiconductor layers 130, 135 and 140, thereby enabling the nitride semiconductor layers 130, 135 and 140 having a good quality to be grown and improving the quality of the light emitting device.

FIGS. 6 to 9 are longitudinal-sectional views illustrating a manufacturing method of a light emitting device in accordance with another embodiment. Some parts in this embodiment which are substantially the same as those in the embodiment shown in FIGS. 1 to 5 are denoted by the same reference numerals, and a detailed description thereof will be omitted.

Figure 6:
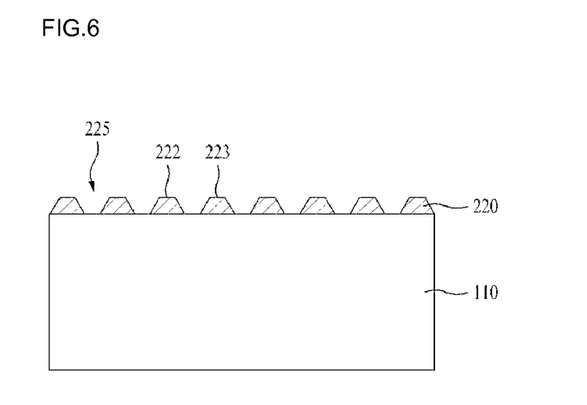
FIGS. 6 to 9 are longitudinal-sectional views illustrating a manufacturing method of a light emitting device in accordance with another embodiment.

With reference to FIG. 6, a first buffer layer 220 having an island structure is formed on a silicon substrate 110. Here, the island structure is provided with a plurality of islands 222 and 223 separated from each other, and portions of the silicon substrate 110 located between the islands 222 and 223 may be exposed. For example, the pin hole structure or the island structure may be determined by adjusting a growth time of the first buffer layer 220.

Figure 7:
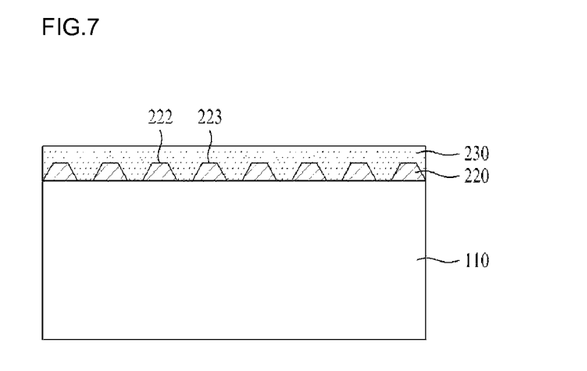

With reference to FIG. 7, a second buffer layer material 230 is formed on the first buffer layer 220 having the island structure. Here, the second buffer layer material 230 may be provided to cover the portions of silicon substrate 110 located between the islands 222 and 223 and the first buffer layer 220. The second buffer layer material 230 may be formed to have the same configuration as the second buffer layer material 130 shown in FIG. 2 through the same method as the second buffer layer material 130 shown in FIG. 2.

Figure 8:
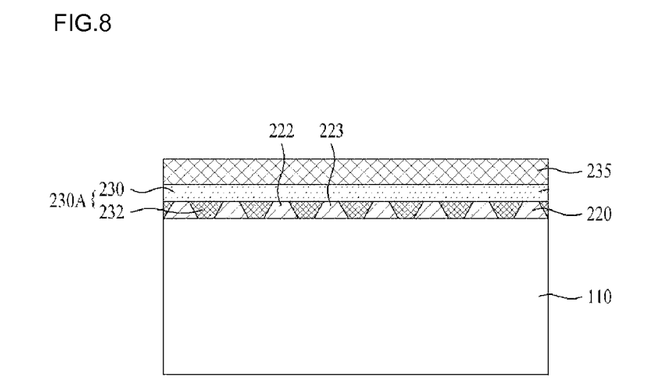

Thereafter, as shown in FIG. 8, a third buffer layer 235 is formed on the second buffer layer material 230. The third buffer layer 235 may be formed to have the same configuration as the third buffer layer 135 shown in FIG. 3 through the same method as the third buffer layer 135 shown in FIG. 3.

Figure 9:
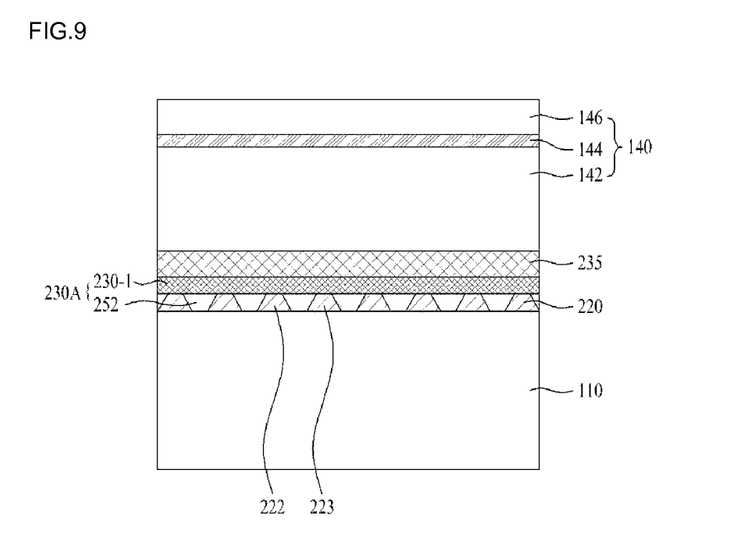

Thereafter, as shown in FIG. 9, a light emitting structure 140 is formed on the third buffer layer 235.

During formation of the nitride semiconductor layers 235 and 140, the second buffer layer material 230 causes a eutectic reaction with the silicon substrate 110, thus forming a second buffer layer 230A including voids 252 between the silicon substrate 110 and the third buffer layer 235. Such a eutectic reaction may occur during formation of the second buffer layer material 230.

For example, gallium (Ga) of the second buffer layer material 230 may cause a eutectic reaction with silicon (Si) of the silicon substrate 10, thus forming GaSi 232. As shown in FIG. 8, the second buffer layer material 230 located between the islands 222 and 223 may be gradually converted into the GaSi 232 due to the eutectic reaction. Further, as shown in FIG. 9, a portion of the second buffer layer 230A located on the islands 222 and 223 may be gradually converted into GaSi. Here, the first buffer layer 220 including aluminum (Al) has a higher melting point than the second buffer layer material 230, and thus does not cause the eutectic reaction with silicon (Si).

Gallium (Ga) of the second buffer layer material 230 causes the eutectic reaction with silicon (Si) of the silicon substrate 110 and is converted into amorphous GaSi and nitrogen (N) of the second buffer layer material 230 may be evaporated. As the density at the second buffer layer 230A causing the eutectic reaction is changed and nitrogen (N) of the second buffer layer 230A material 130 causing the eutectic reaction is evaporated, voids 252 may be formed between the islands 222 and 232. Here, amorphous GaSi may remain within the voids 252.

FIG. 8 illustrates the GaSi 232 formed between the islands 222 and 223 due to the eutectic reaction, and FIG. 9 illustrates conversion of a portion 230-1 of the second buffer layer 230A located on the first buffer layer 220 into GaSi, as the eutectic reaction proceeds further, and illustrates the voids 252 formed between the islands 222 and 223.

Although the embodiment illustrates formation of the voids 252 between the islands 222 and 223 and conversion of all of the portion 230-1 of the second buffer layer 230A located on the first buffer layer 220 into GaSi, the disclosure is not limited thereto and voids may be formed at the portion 230-1 of the second buffer layer 230A located on the first buffer layer 220. That is, the size of the voids 252 and the extent of the portion of the second buffer layer 230A converted into GaSi may be changed according to process conditions.

The height of the lower surface of the second buffer layer 230A exposed according to formation of the voids 252 may be equal to or differ from the height of the upper surface of the first buffer layer 220.

Figure 12:
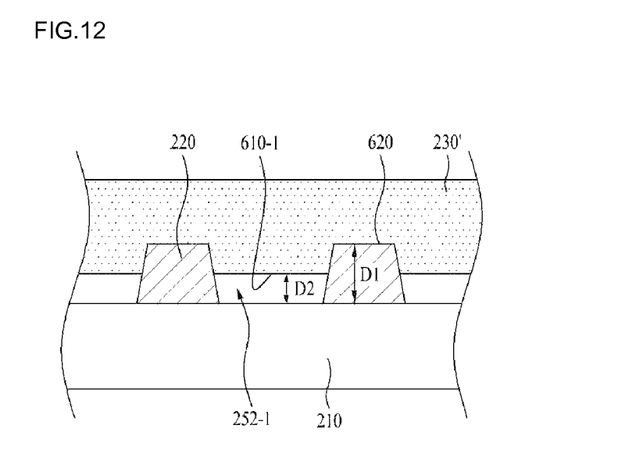
FIG. 12 is a longitudinal-sectional view illustrating a second buffer layer having voids in accordance with a first embodiment.

FIG. 12 is a longitudinal-sectional view illustrating a second buffer layer 230' having voids 252-1 in accordance with a first embodiment.

With reference to FIG. 12, the height of a lower surface 610-1 of the second buffer layer 230' exposed according to formation of the voids 252-1 may be lower than the height of an upper surface 620 of the first buffer layer 220. That is, a distance D2 from the surface of a silicon substrate 210 to the lower surface 610-1 of the second buffer layer 230' exposed by the voids 252-1 may be smaller than or equal to a thickness D1 of the first buffer layer 220 (D2≦D1).

Figure 13:
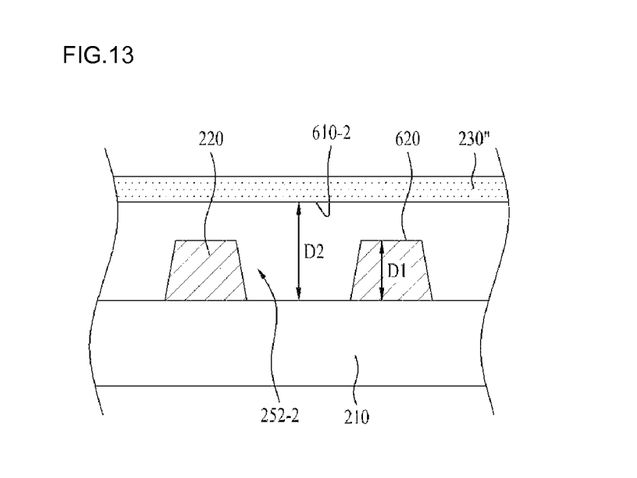
FIG. 13 is a longitudinal-sectional view illustrating a second buffer layer having voids in accordance with a second embodiment.

FIG. 13 is a longitudinal-sectional view illustrating a second buffer layer 230" having voids 252-2 in accordance with a second embodiment.

With reference to FIG. 13, the height of a lower surface 610-2 of the second buffer layer 230" exposed according to formation of the voids 252-2 may be higher than the height of an upper surface 620 of the first buffer layer 220. That is, a distance D2 from the surface of a silicon substrate 210 to the lower surface 610-2 of the second buffer layer 230" exposed by the voids 252-2 may be greater than a thickness D1 of the first buffer layer 220 (D2>D1).

Further, the second buffer layers 230' and 230" shown in FIGS. 12 and 13 may include GaSi, and an extent of the GaSi in the second buffer layers 230' and 230" may vary according to process conditions. For example, the entirety of each of the second buffer layers 230' and 230" may be a GaSi layer, or each of the second buffer layers 230' and 230" may include a GaSi layer.

Figure 10:
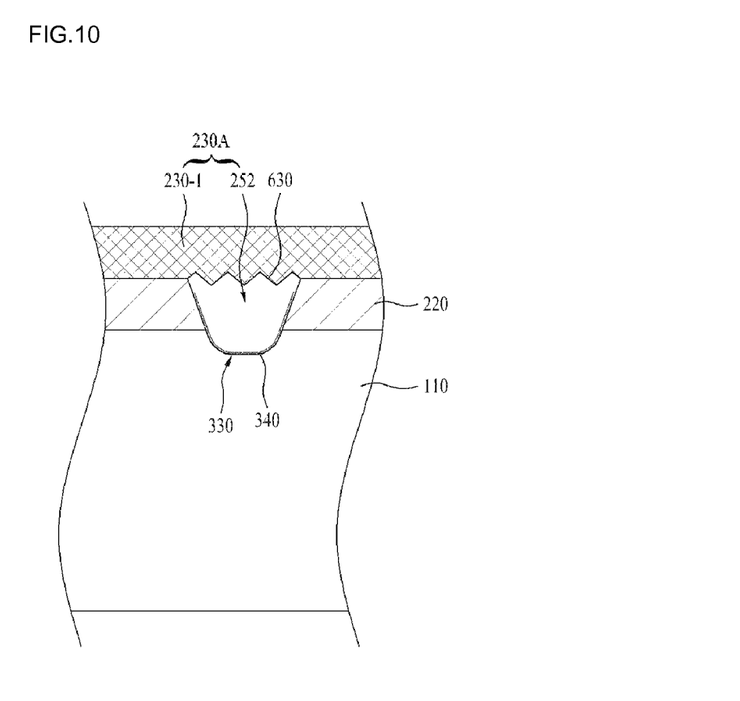
FIG. 10 is a partially enlarged view of a void shown in FIG. 9.

FIG. 10 is a partially enlarged view of the void 252 shown in FIG. 9.

With reference to FIG. 10, the voids 252 may be formed between the silicon substrate 110 and the third buffer layer 235 due to formation of gallium-silicon and evaporation of nitrogen according to the eutectic reaction. Further, holes or voids 330 may be formed at portions of the silicon substrate 110 contacting the second buffer layer material 230 shown in FIG. 7. The amorphous GaSi 340 may remain on the surfaces of the first buffer layer 220 and the holes 330 of the silicon substrate 110 exposed due to formation of the voids 252.

Further, the lower surface of the second buffer layer 230A exposed by the voids 252 may have roughness 630 due to the eutectic reaction. Such roughness 630 may cause diffused reflection of incident light, and may thus improve light extraction efficiency of the light emitting device.

In this embodiment, since the voids 252 are formed between the silicon substrate 110 and the third buffer layer 235 during growth of the nitride semiconductor layers 230, 235 and 140 on the silicon substrate 110, and thus reduces or eliminates strain caused by a lattice constant difference between the silicon substrate 110 and the nitride semiconductor layers 230, 235 and 140, thereby improving the quality of the light emitting device.

Figure 14:
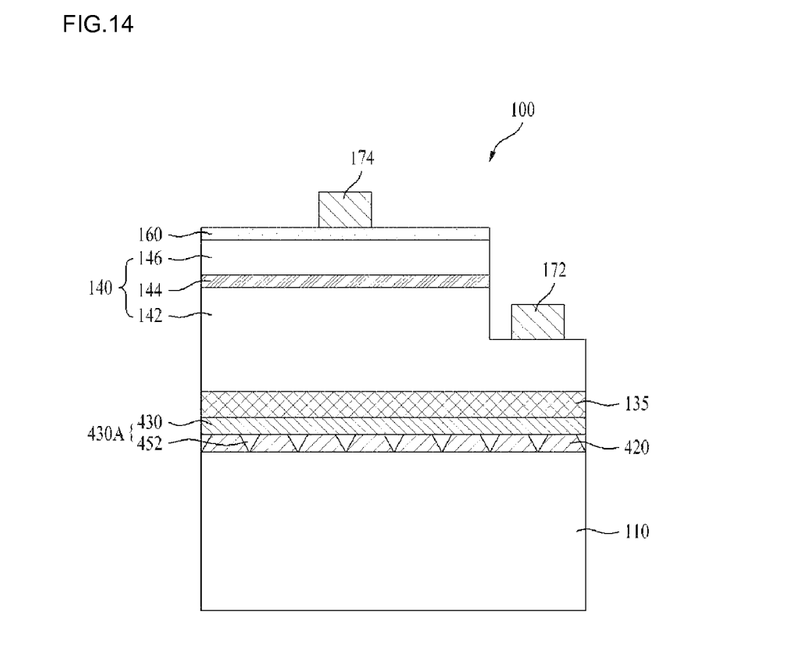
FIG. 14 is a longitudinal-sectional view illustrating a light emitting device in accordance with one embodiment.

FIG. 14 is a longitudinal-sectional view illustrating a light emitting device 100 in accordance with one embodiment. Some parts in this embodiment which are substantially the same as those in the embodiments shown in FIGS. 1 to 10 are denoted by the same reference numerals, and a detailed description thereof will be omitted.

With reference to FIG. 14, the light emitting device 100 includes a growth substrate, a light emitting structure 140, a conductive layer 160, a first electrode 172, and a second electrode 174.

The growth substrate includes a base substrate 110, a first buffer layer 420, a second buffer layer 430A, and a third buffer layer 135. The base substrate 110 may be a substrate for growing a semiconductor thereon, for example, a silicon substrate, but is not limited thereto.

The first buffer layer 420 is disposed on the silicon substrate 110. The first buffer layer 420 may be the first buffer layer 120 shown in FIG. 1 or the first buffer layer 220 shown in FIG. 6.

The first buffer layer 420 may have the structure provided with the pin holes 125 shown in FIG. 1 or the structure provided with the islands 222 and 223 shown in FIG. 6. The composition of the first buffer layer 420 may be the same as that of the above-described first buffer layer 120 or 220.

The second buffer layer 430A is disposed on the first buffer layer 420, and voids 452 are formed between the second buffer layer 430A and the silicon substrate 110. Here, the voids 452 may be the voids 152 shown in FIG. 4 or the voids 252 shown in FIG. 9.

For example, the voids 452 may be formed within the pin holes 125 located between the second buffer layer 130-1 and the silicon substrate 110. Otherwise, the voids 452 may be formed between the islands 222 and 223 located between the second buffer layer 230-1 and the silicon substrate 110.

The voids 452 may have the shape of a pin hole, a cylinder, a polyhedron, or a polypyramid.

The second buffer layer 430A may be formed of a nitride semiconductor having a formula of $Al_xM_yGa_{(1-x-y)}N$ ($0 \leq x+y \leq 1$, $0 \leq x \leq 0.5$, M=indium (In) and/or boron (B)). The second buffer layer 430A may include the voids 452 and GaSi 430. The second buffer layer 430A may be one of the second buffer layers 130A and 230A in accordance with the above-described embodiments.

The light emitting structure 140 is disposed on the second buffer layer 430A. The third buffer layer 135 is disposed between the light emitting structure 140 and the second buffer layer 430A.

The light emitting structure 140 may include a first conductivity-type semiconductor layer 142, an active layer 144, and a second conductivity-type semiconductor layer 146. The light emitting structure 140 exposes a portion of the first conductivity-type semiconductor layer 142. For example, the light emitting structure 140 may have a structure in which the second conductivity-type semiconductor layer 146, the active layer 144, and the first conductivity-type semiconductor layer 142 are selectively etched using a MESA etching method.

The conductive layer 160 having high light transmittance may increase extraction efficiency of light emitted from the active layer 144 to the second conductivity-type semiconductor layer 146, as well as reducing diffused reflection. The conductive layer 160 may be formed of an oxide-based material having high transmittance of an emitting wavelength.

The conductive layer 160 may be a transparent conductive oxide layer, for example, having a single-layer structure or a multi-layer structure including at least one selected from among the group consisting of indium tin oxide (ITO), tin oxide (TO), indium zinc oxide (IZO), indium tin zinc oxide (ITZO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Ni/IrOx/Au, and Ni/IrOx/Au/ITO.

The first electrode 172 may be disposed on the exposed portion of the first conductivity-type semiconductor layer 142. The second electrode 174 may be disposed on the conductive layer 160. The first electrode 172 and the second electrode 174 may be formed of at least one selected from the group consisting of titanium (Ti), chrome (Cr), nickel (Ni), aluminum (Al), platinum (Pt) and gold (Au).

The light emitting device 100 in accordance with this embodiment includes the second buffer layer 430A having the voids 452 between the silicon substrate 110 and the third buffer layer 135, wherein the silicon substrate 110 has the pin holes or the island structure. Thus the embodiment can reduce or eliminate strain due to a lattice constant difference between the silicon substrate 110 and the nitride semiconductor layers 430, 135 and 140, thereby improving the crystalline quality.

Figure 15:
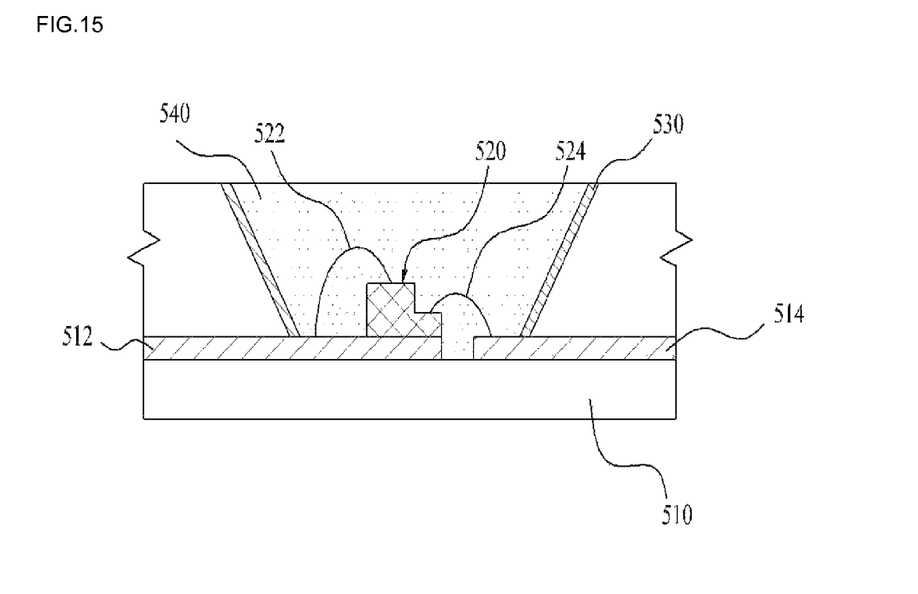
FIG. 15 is a longitudinal-sectional view illustrating a light emitting device package including a light emitting device in accordance with one embodiment.

FIG. 15 is a longitudinal-sectional view illustrating a light emitting device package including a light emitting device in accordance with one embodiment. With reference to FIG. 15, the light emitting device package includes a package body 510, a first metal layer 512, a second metal layer 514, a light emitting device 520, a first wire 522, a second wire 524, a reflective plate 530, and a resin layer 540.

The package body 510 has a structure with a cavity at one side region thereof. Here, the side wall of the cavity may be inclined. The package body 510 may be formed of a substrate having excellent insulation and thermal conductivity, such as a silicon-based wafer level package, a silicon substrate, silicon carbide (SiC), aluminum nitride (AlN), etc. and may have a structure in which plural substrates are stacked. This embodiment is not limited to the above-described material, structure and shape of the package body 510.

The first metal layer 512 and the second metal layer 514 are disposed on the surface of the package body 510 so as to be electrically separated from each other in consideration of heat discharge or mounting of the light emitting device 520. The light emitting device 520 is electrically connected to the first metal layer 512 and the second metal layer 514 through the first wire 522 and the second wire 524. Here, the light emitting device 520 may be the light emitting device 100 shown in FIG. 14.

For example, the first wire 522 may electrically connect the second electrode 174 of the light emitting device 100 to the first metal layer 512, and the second wire 524 may electrically connect the first electrode 172 of the light emitting device 100 to the second metal layer 514.

The reflective plate 530 may be formed on the side wall of the cavity of the package body 510 to guide light emitted from the light emitting device 520 in a designated direction. The reflective plate 530 may be formed of a light reflective material, and for example, be formed through metal coating or be formed of metal flakes.

The resin layer 540 surrounds the light emitting device 520 located within the cavity of the package body 510, and protects the light emitting device 520 from external environments. The resin layer 540 may be formed of a colorless transparent polymer resin material, such as epoxy or silicon. The resin layer 540 may include phosphors to change the wavelength of light emitted from the light emitting device 520.

An array of plural light emitting device packages in accordance with this embodiment may be mounted on a substrate, and optical members, such as a light guide panel, a prism sheet, a diffusion sheet, etc., may be disposed on an optical path of the light emitting device packages. The light emitting device packages, the substrate and the optical members may function as a backlight unit.

In accordance with other embodiments, the light emitting devices or the light emitting device package in accordance with the above-described embodiments may constitute a display apparatus, an indicating apparatus and a lighting system, and, for example, the lighting system may include a lamp or a streetlight.

Figure 16:
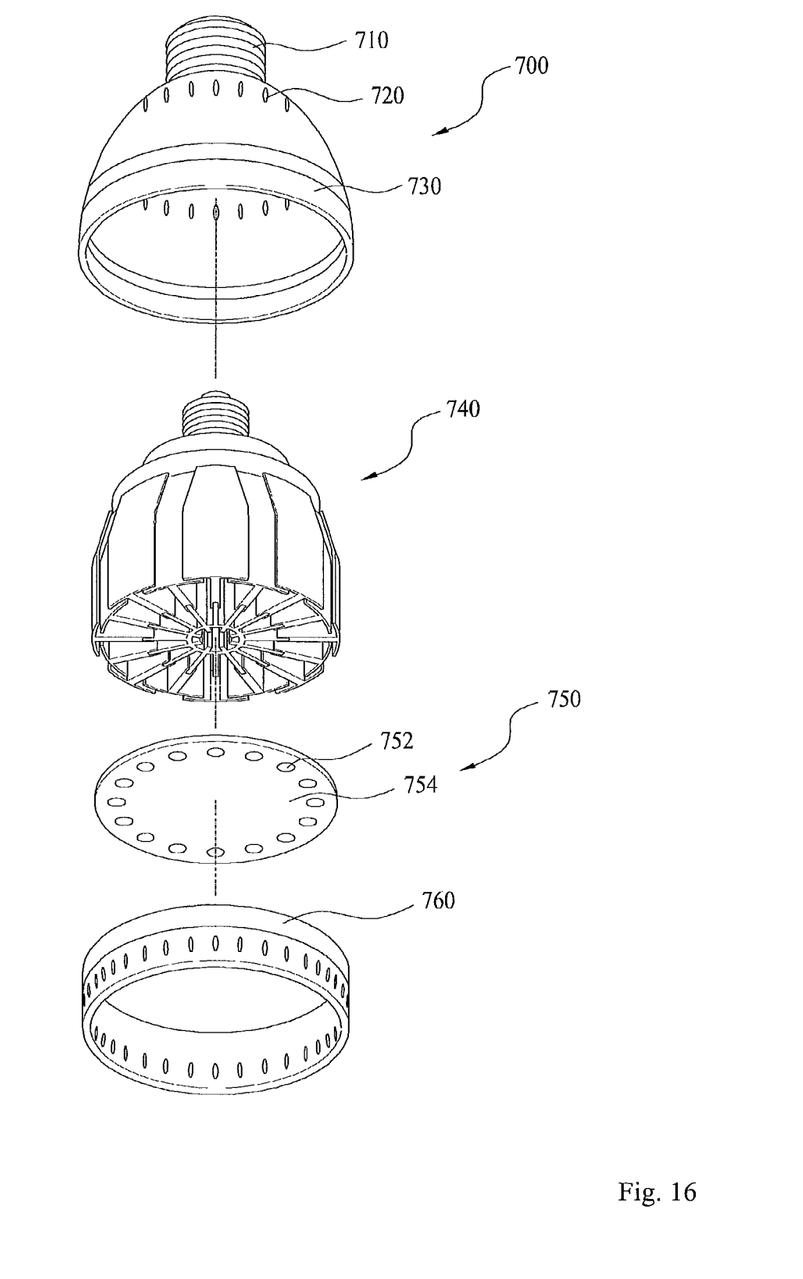
FIG. 16 is an exploded perspective view of a lighting apparatus including light emitting device packages in accordance with one embodiment.

FIG. 16 is an exploded perspective view of a lighting apparatus including light emitting device packages in accordance with one embodiment. With reference to FIG. 16, the lighting apparatus in accordance with this embodiment includes a light source 750 to project light, a housing 700 in which the light source 750 is installed, a heat dissipation unit 740 to dissipate heat generated by the light source 750, and a holder 760 to connect the light source 750 and the heat dissipation unit 7140 to the housing 700.

The housing 700 includes a socket connector 710 connected to an electrical socket (not shown) and a body 730 connected to the socket connector 710 and accommodating the light source 750. One air flow hole 720 may be formed through the body 730.

Although this embodiment illustrates a plurality of air flow holes 720 as being provided on the body 730 of the housing 700, one air flow hole 720 may be formed, or plural air flow holes 720 may be arranged in a radial shape, as shown in FIG. 16, or various other shapes.

The light source 750 includes a plurality of light emitting device packages 752 on a substrate 754. Here, the light emitting device package 752 may be the light emitting device package in accordance with the embodiment shown in FIG. 6. Here, the substrate 754 may have a shape which is capable of being inserted into an opening of the housing 700, and be formed of a material having high thermal conductivity so as to transfer heat to the heat dissipation unit 740, as described later.

The holder 760 is provided under the light source 750. The holder 760 may include a frame and air flow holes. Further, although not shown in FIG. 16, optical members may be provided under the light source 750 so as to diffuse, scatter or converge light emitted from the light emitting device packages 752 of the light source 750.

Figure 17A:
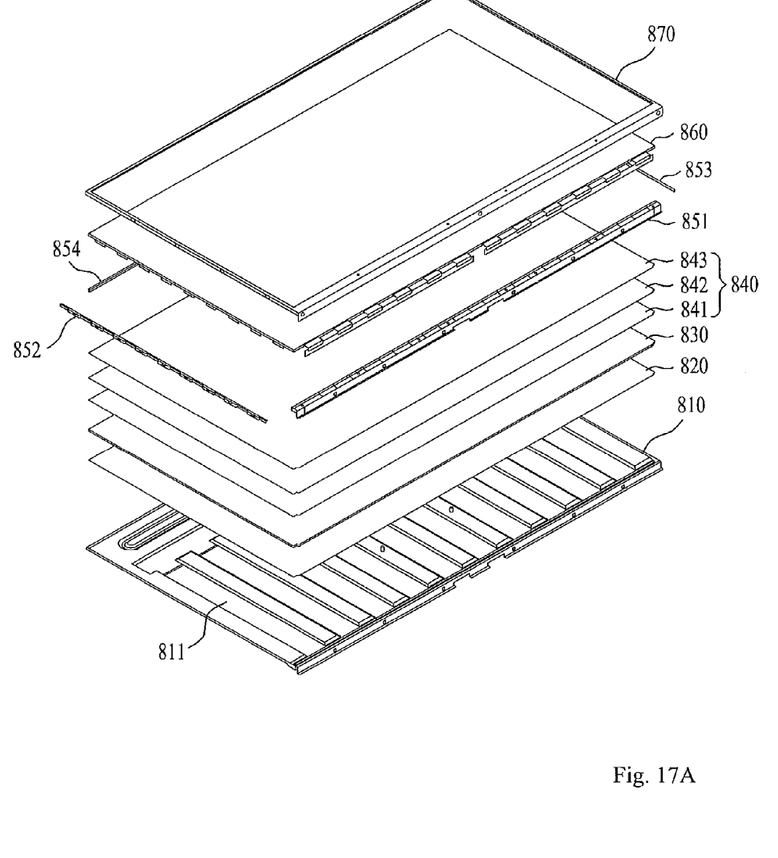
FIG. 17A is an exploded perspective view of a display apparatus including light emitting device packages in accordance with one embodiment.
Figure 17B:
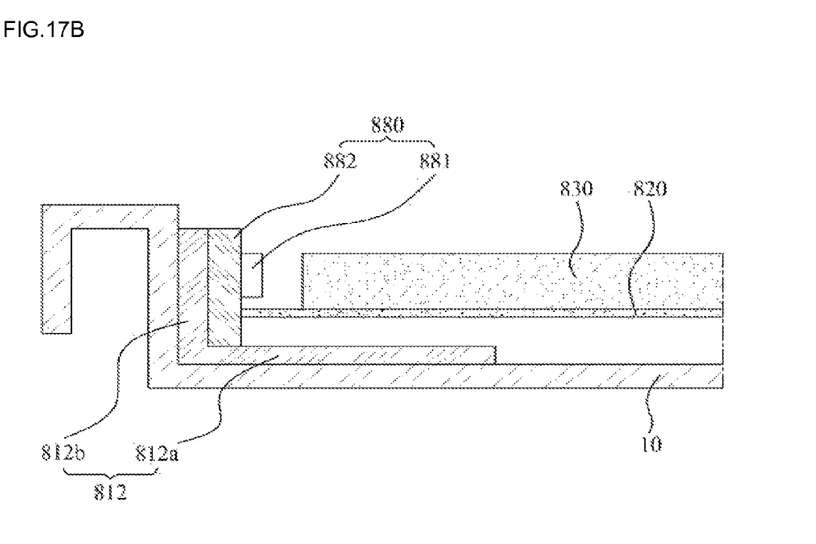
FIG. 17B is a longitudinal-sectional view illustrating a light source of the display apparatus shown in FIG. 17A.

FIG. 17A is an exploded perspective view of a display apparatus including light emitting device packages in accordance with one embodiment, and FIG. 17B is a longitudinal-sectional view illustrating a light source of the display apparatus shown in FIG. 17A.

With reference to FIGS. 17A and 17B, the display apparatus includes a backlight unit, a liquid crystal panel 860, a top cover 870, and fixing members 851, 852, 853 and 854.

The backlight unit includes a bottom cover 810, a light emitting module 880 provided at one side of the inside of the bottom cover 810, a reflective plate 820 disposed on the front surface of the bottom cover 810, a light guide panel 830 disposed in front of the reflective plate 820 to guide light emitted from the light emitting module 880 to the front part of the display apparatus, and optical members 840 disposed in front of the light guide panel 830. The liquid crystal panel 860 is disposed in front of the optical members 840, the top cover 870 is disposed in front of the liquid crystal display panel 860, and the fixing members 851, 852, 853 and 854 are disposed between the bottom cover 810 and the top cover 870 to fix the bottom cover 810 and the top cover 870 together.

The light guide panel 830 serves to guide light emitted from the light emitting module 880 so as to convert the light into surface light. The reflective plate 820 disposed at the rear of the light guide panel 830 serves to reflect light emitted from the light emitting module 880 toward the light guide panel 830 so as to improve light efficiency. The reflective plate 820 may be provided as a separate component, as shown in FIGS. 17A and 17B, or be provided by coating the rear surface of the light guide panel 830 or the front surface of the bottom cover 810 with a material having high reflectivity. Here, the reflective plate 820 may be formed of a material having high reflectivity and usable as an ultra-thin type, such as polyethylene terephthalate (PET).

Further, the light guide panel 830 scatters light emitted from the light emitting module 880 so as to uniformly distribute the light throughout the entirety of a screen of the liquid crystal display panel 860. Therefore, the light guide panel 830 is formed of a material having a high index of refraction and high transmittance, such as polymethylmethacrylate (PMMA), polycarbonate (PC) or polyethylene (PE).

The optical members 840 provided on the light guide panel 830 diffuse light emitted from the light guide panel 830 by a designated angle. The optical members 840 enable light guided by the light guide panel 830 to be uniformly irradiated toward the liquid crystal display panel 860.

As the optical members 840, optical sheets, such as a diffusion sheet, a prism sheet and a protection sheet, may be selectively stacked, or a micro-lens array may be used. Here, a plurality of optical sheets may be used, and the optical sheets may be formed of a transparent resin, such as acrylic resin, polyurethane resin or silicon resin. Further, the prism sheet may include a phosphor sheet, as described above.

The liquid crystal display panel 860 may be provided on the front surface of the optical members 840. Here, it will be apparent that, instead of the liquid crystal display panel 860, other kinds of display apparatuses requiring a light source may be provided.

The reflective plate 820 is mounted on the bottom cover 810, and the light guide panel 830 is mounted on the reflective plate 820. Thereby, the reflective plate 820 may directly contact a heat dissipation member (not shown). The light emitting module 880 includes light emitting device packages 881 and a printed circuit board 882. The light emitting device packages 881 are mounted on the printed circuit board 882. Here, the light emitting device package 881 may be the light emitting device package in accordance with the embodiment shown in FIG. 15.

The printed circuit board 881 may be bonded to a bracket 812. Here, the bracket 812 may be formed of a material having high thermal conductivity so as to discharge heat as well as to fix the light emitting device packages 881, and, although not shown in the drawings, heat pads may be provided between the bracket 812 and the light emitting device packages 881 so as to facilitate heat transfer. Further, the bracket 812 is provided in an L shape, as shown in FIG. 17B, a horizontal part 812a of the bracket 812 is supported by the bottom cover 810, and a vertical part 812a of the bracket 812 is used to fix the printed circuit board 882.

As apparent from the above description, a growth substrate and a light emitting device in accordance with one embodiment may have improved quality while reducing strain.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A growth substrate comprising:
   a base substrate;
   a first semiconductor buffer layer disposed on the base substrate and having an exposing portions of the base substrate;
   a second semiconductor buffer layer covering the first buffer layer and the exposed portions of the base substrate, wherein the second buffer layer is formed of a material causing a eutectic reaction with the base substrate; and
   a third semiconductor buffer layer disposed on the second buffer layer,
   wherein the second buffer layer includes voids.

2. The growth substrate according to claim 1, wherein the base substrate is a silicon substrate.

3. The growth substrate according to claim 1, wherein the first buffer layer includes pin holes or islands exposing the portions of the base substrate, wherein the islands are separated from each other.

4. The growth substrate according to claim 1, wherein the second buffer layer is formed of a material having a lower melting point than the first buffer layer.

5. The growth substrate according to claim 1, wherein the third buffer layer is formed of the same material as the first buffer layer.

6. The growth substrate according to claim 1, wherein the second buffer layer is formed of a nitride semiconductor having a formula of $Al_xM_yGa_{(1-x-y)}N$ ($0 \leq x+y \leq 1$, $0 \leq x \leq 0.5$, M=indium (In) and/or boron (B)).

7. The growth substrate according to claim 6, wherein the first buffer layer and the third buffer layer are formed of a nitride semiconductor having a formula of $Al_xIn_yGa_{(1-x-y)}N$ ($0 \leq x+y \leq 1$, $0 \leq y \leq 0.5$).

8. The growth substrate according to claim 7, wherein an Al content of the second buffer layer is smaller than an Al content of the first buffer layer and the third buffer layer.

9. The growth substrate according to claim 1, wherein the voids are formed between the base substrate and the third buffer layer.

10. The growth substrate according to claim 3, wherein portions of the silicon substrate under the voids include holes.

11. The growth substrate according to claim 7, wherein the second buffer layer includes GaSi.

12. The growth substrate according to claim 1, wherein a thickness of the third buffer layer is greater than a thickness of the first buffer layer.

13. A light emitting device comprising:
    a silicon substrate;
    a first semiconductor buffer layer disposed on the silicon substrate and having an exposing portions of the silicon substrate;
    a second semiconductor buffer layer covering the first buffer layer and the exposed portions of the silicon substrate, wherein the second buffer layer is formed of a material causing a eutectic reaction with the silicon substrate;
    a third semiconductor buffer layer disposed on the second buffer layer; and
    a semiconductor light emitting structure disposed on the third buffer layer,
    wherein the second buffer layer includes voids.

14. The light emitting device according to claim 13, wherein the first buffer layer includes pin holes or islands exposing the portions of the base substrate, wherein the islands are separated from each other.

15. The light emitting device according to claim 13, wherein the second buffer layer is formed of a material having a lower melting point than the first buffer layer.

16. The light emitting device according to claim 13, wherein the second buffer layer is formed of a nitride semiconductor having a formula of $Al_xM_yGa_{(1-x-y)}N$ ($0 \leq x+y \leq 1$, $0 \leq x \leq 0.5$, M=indium (In) and/or boron (B)).

17. The light emitting device according to claim 16, wherein the first buffer layer and the third buffer layer are formed of a nitride semiconductor having a formula of $Al_xIn_yGa_{(1-x-y)}N$ ($0 \leq x+y \leq 1$, $0 \leq y \leq 0.5$).

18. The light emitting device according to claim 17, wherein an Al content of the second buffer layer is smaller than an Al content of the first buffer layer and the third buffer layer.

19. The light emitting device according to claim 14, wherein portions of the silicon substrate under the voids include holes.

20. The light emitting device according to claim 18, wherein the second buffer layer includes GaSi.

* * * * *